United States Patent
Hada

(10) Patent No.: US 9,482,723 B2
(45) Date of Patent: Nov. 1, 2016

(54) WIRELESS POWER SUPPLY SYSTEM, POWER TRANSMISSION DEVICE, AND POWER RECEIVING DEVICE

(71) Applicant: CANON KABUSHIKI KAISHA, Tokyo (JP)

(72) Inventor: Manabu Hada, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 184 days.

(21) Appl. No.: 14/192,699

(22) Filed: Feb. 27, 2014

(65) Prior Publication Data

US 2014/0247052 A1    Sep. 4, 2014

(30) Foreign Application Priority Data

Mar. 1, 2013   (JP) ................. 2013-040930

(51) Int. Cl.
| | |
|---|---|
| *G01N 27/416* | (2006.01) |
| *G01R 31/40* | (2014.01) |
| *H02J 7/00* | (2006.01) |
| *H02J 7/02* | (2016.01) |
| *H02J 17/00* | (2006.01) |

(52) U.S. Cl.
CPC ............. *G01R 31/40* (2013.01); *H02J 7/0021* (2013.01); *H02J 7/025* (2013.01); *H02J 17/00* (2013.01)

(58) Field of Classification Search
CPC ...... H02J 7/025; H01F 38/14; Y02T 90/122; B60L 11/182; Y02E 60/12; G01R 31/3648; G01R 31/3627; G01R 31/3662; G01R 31/3631
USPC ....................................... 324/426
See application file for complete search history.

(56) References Cited

U.S. PATENT DOCUMENTS

| | | | | |
|---|---|---|---|---|
| 5,391,974 | A * | 2/1995 | Shiojima ............... | H02J 7/0091 320/150 |
| 8,373,388 | B2 * | 2/2013 | Kim ........................ | H02J 7/025 307/104 |
| 2004/0145342 | A1 * | 7/2004 | Lyon ....................... | H02J 7/025 320/108 |
| 2009/0021219 | A1 * | 1/2009 | Yoda ...................... | H02J 7/0011 320/137 |
| 2009/0033280 | A1 * | 2/2009 | Choi ....................... | H02J 7/025 320/108 |
| 2011/0140653 | A1 * | 6/2011 | Jung ....................... | H02J 7/025 320/108 |
| 2011/0264297 | A1 * | 10/2011 | Nakano .................... | G06F 1/26 700/297 |
| 2012/0280650 | A1 * | 11/2012 | Kim ........................ | H02J 17/00 320/108 |

FOREIGN PATENT DOCUMENTS

| | | |
|---|---|---|
| JP | 2009-136132 A | 6/2009 |
| JP | 2012-44735 A | 3/2012 |

* cited by examiner

*Primary Examiner* — Arun Williams
(74) *Attorney, Agent, or Firm* — Canon USA, Inc. IP Division

(57) ABSTRACT

A wireless power supply system includes a power transmission device capable of transmitting power to a plurality of power receiving devices by a magnetic field resonance method. The power transmission device includes a detection unit configured to detect an amount of charge of each of the plurality of power receiving devices, a determination unit configured to determine, if the amount of charge of a certain power receiving device is not increased even when a predetermined time has elapsed since start of power transmission to the certain power receiving device, whether a cause of failure to increase the amount of charge is the power transmission device or the certain power receiving device, based on the amount of charge of any other power receiving device detected by the detection unit, and a notification unit configured to transmit a notification about the determination result by the determination unit.

5 Claims, 8 Drawing Sheets

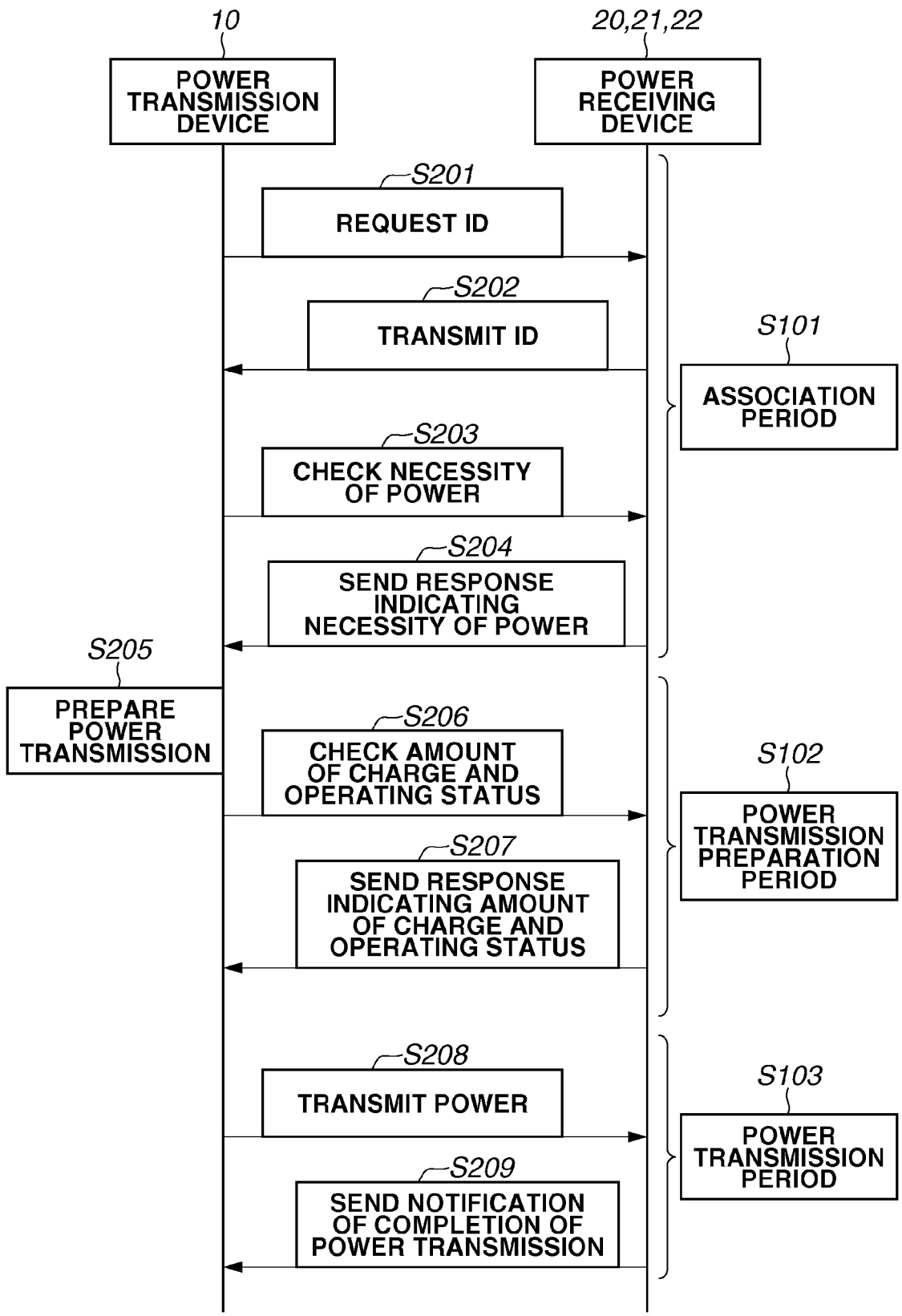

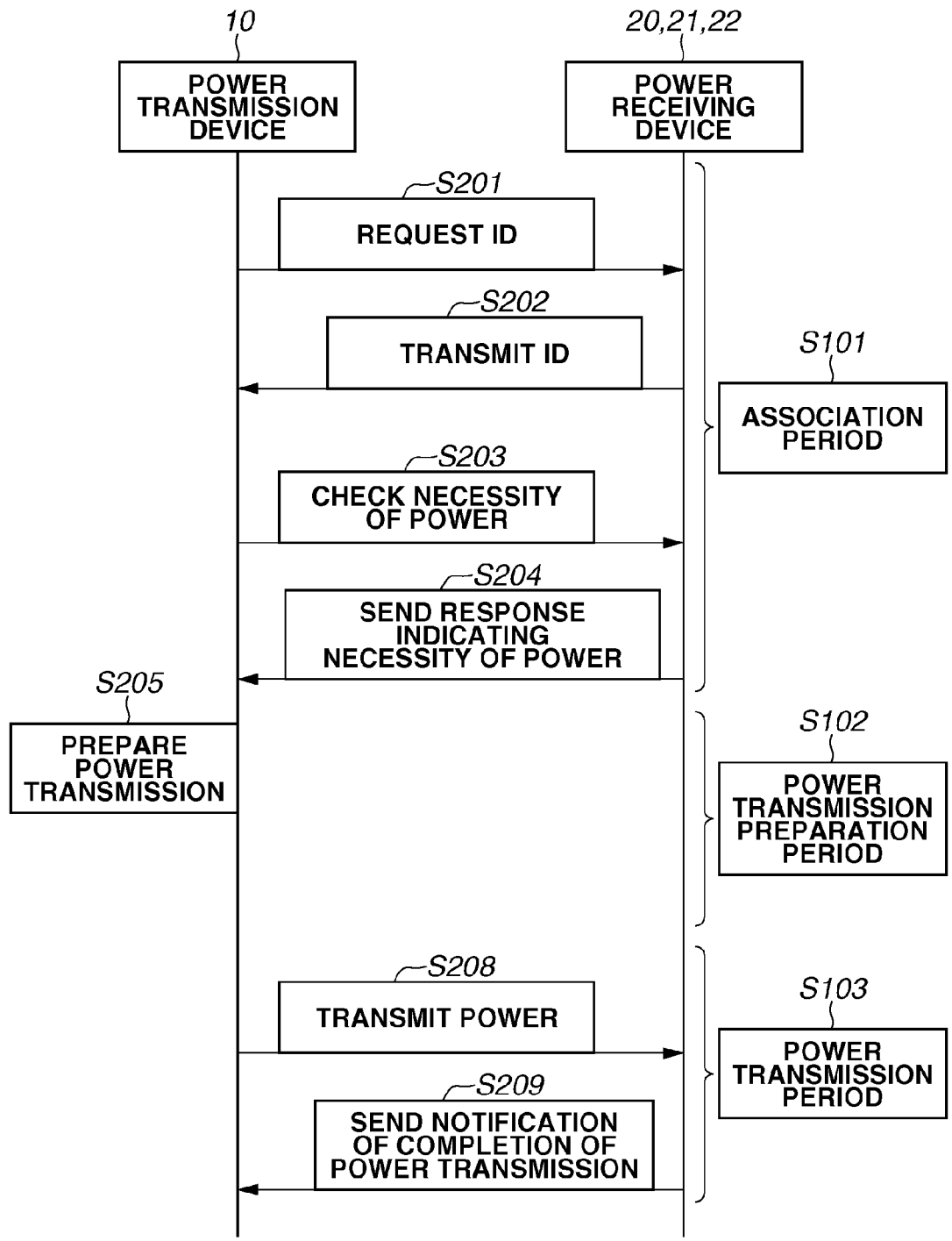

WIRELESS POWER SUPPLY SYSTEM, POWER TRANSMISSION DEVICE, AND POWER RECEIVING DEVICE

BACKGROUND OF THE INVENTION

1. Field of the Invention

The present invention relates to a wireless power supply system, a power transmission device, and a power receiving device. The present invention particularly relates to a wireless power supply system including a power transmission device capable of wirelessly supplying power to a plurality of power receiving devices, and a power transmission device and a power receiving device that are applicable to the wireless power supply system.

2. Description of the Related Art

Four methods are known for supplying power in a contactless (wireless) manner: an electromagnetic induction method, a magnetic field resonance method, an electric field coupling method, and a radio wave receiving method. In recent years, among these four methods, the magnetic field resonance method has attracted attention because of its capabilities of transmitting a large amount of power and transmitting power over a long distance. For example, Japanese Patent Application Laid-Open No. 2009-136132 discusses a one-to-N (N is a natural number of two or more) power supply system for transmitting power from a power transmission device to a plurality of wireless power receiving devices by utilizing the magnetic field resonance method having the long-distance power transmission capability.

Further, Japanese Patent Application Laid-Open No. 2012-44735 discusses a method for detecting an abnormality in a power transmission path between one power transmission device and N wireless power receiving devices.

In the configuration discussed in Japanese Patent Application Laid-Open No 2009-136132, during standby without supplying power, the power transmission device transmits a predetermined pulse signal to search for any wireless power receiving device that is close within several meters of the power transmission device. When the wireless power receiving device transmits its own unique identification (ID) to the power transmission device, the power transmission device determines whether the wireless power receiving device is a target to be power supplied. If the wireless power receiving device is a target to be power supplied, the power transmission device wirelessly transmits power to the wireless power receiving device. At this point, the power transmission device can transmit a unique code to the wireless power receiving device to individually receive information about the amount of charge and the status of the device.

In the configuration discussed in Japanese Patent Application Laid-Open No. 2012-44735, the presence of any foreign matter between the power transmission device and the power receiving device is detected by using a sensor or a heating sensor to perform control so that the power receiving device cannot receive power on its side when the foreign matter has been detected.

In a configuration such as that discussed in Japanese Patent Application Laid-Open No. 2012-44735, an operation is performed to stop supplying power when an abnormality has been detected. More specifically, a secondary side device (power receiving device) includes a sensor for detecting an abnormality, and according to the detection result by the sensor, transmission and reception of power is stopped so that heating due to foreign matter can be avoided. However, in such a configuration, if power is not normally supplied due to a cause other than the foreign matter, it cannot be determined whether the cause is on the power supply device side or on the power receiving device side.

SUMMARY OF THE INVENTION

The present invention is directed to, if a battery fails to be charged in a wireless power supply system, determining whether the failure has been caused by a power supply device or a power receiving device and informing the user of the determination result so that the cause of the failure can be detected at an early stage.

According to an aspect of the present disclosure, a wireless power supply system includes a power transmission device capable of transmitting power to a plurality of power receiving devices by a magnetic field resonance method. The power transmission device includes a detection unit configured to detect an amount of charge of each of the plurality of power receiving devices, a determination unit configured to determine, if the amount of charge of a certain power receiving device is not increased even when a predetermined time has elapsed since start of power transmission to the certain power receiving device, whether a cause of failure to increase the amount of charge is the power transmission device or the certain power receiving device, based on the amount of charge of any other power receiving device detected by the detection unit, and a notification unit configured to transmit a notification about the determination result by the determination unit.

Further features of the present invention will become apparent from the following description of exemplary embodiments with reference to the attached drawings.

BRIEF DESCRIPTION OF THE DRAWINGS

FIGS. 6A and 6B are sequence diagrams illustrating transmission and reception of data between the power transmission device and the power receiving device using the superframe.

DESCRIPTION OF THE EMBODIMENTS

Figure 1:
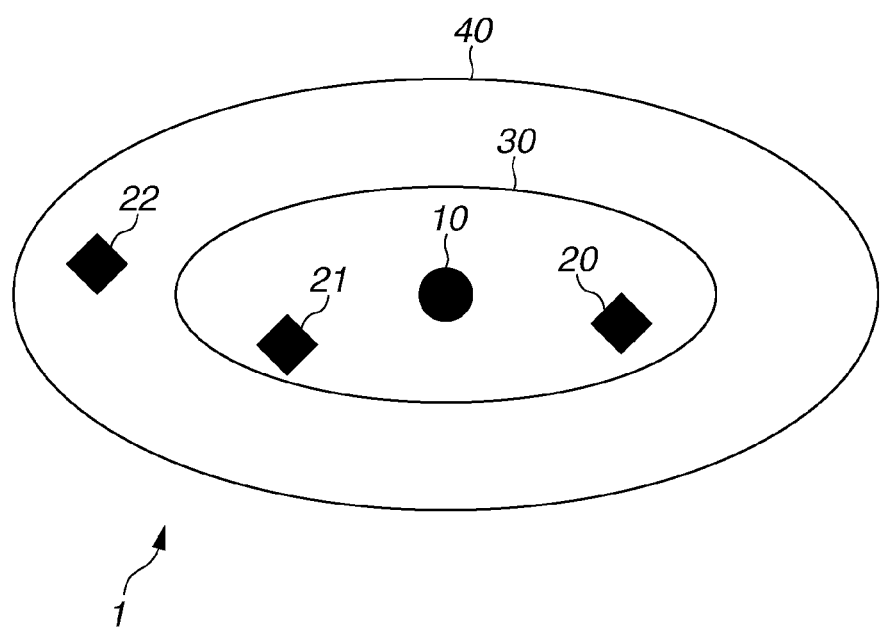
FIG. 1 is a schematic view illustrating a configuration of a wireless power supply system.

FIG. 1 is a schematic view illustrating a configuration of a wireless power supply system 1 according to an exemplary embodiment. The wireless power supply system 1 according to the exemplary embodiment includes a power transmission device 10 for transmitting power (supplying power) by the magnetic field resonance method. Further, in the wireless power supply system 1 according to the exemplary embodiment, a single power transmission device 10 can wirelessly transmit power to a plurality of power receiving devices 20, 21, and 22. Although FIG. 1 illustrates three power receiving devices 20, 21, and 22, the number of power receiving devices is not limited to three.

The power transmission device 10 wirelessly transmits power to each of the power receiving devices 20, 21, and 22 by the magnetic field resonance method. Further, the power transmission device 10 performs data communication required for supplying power with each of the power receiving devices 20, 21, and 22.

Each of the power receiving devices 20, 21, and 22 wirelessly receives power from the power transmission device 10. Each of the power receiving devices 20, 21, and 22 performs data communication required for supplying power with the power transmission device 10. A power supply area 30 is an area where power can be supplied from the power transmission device 10 to the power receiving devices 20, 21, and 22.

A communication area 40 is an area where data communication can be performed between the power transmission device 10 and each of the power receiving devices 20, 21, and 22.

The relationship between the power supply area 30 and the communication area 40 is such that the communication area 40 is larger than the power supply area 30, and the power supply area 30 is completely included in the communication area 40.

Figure 2:
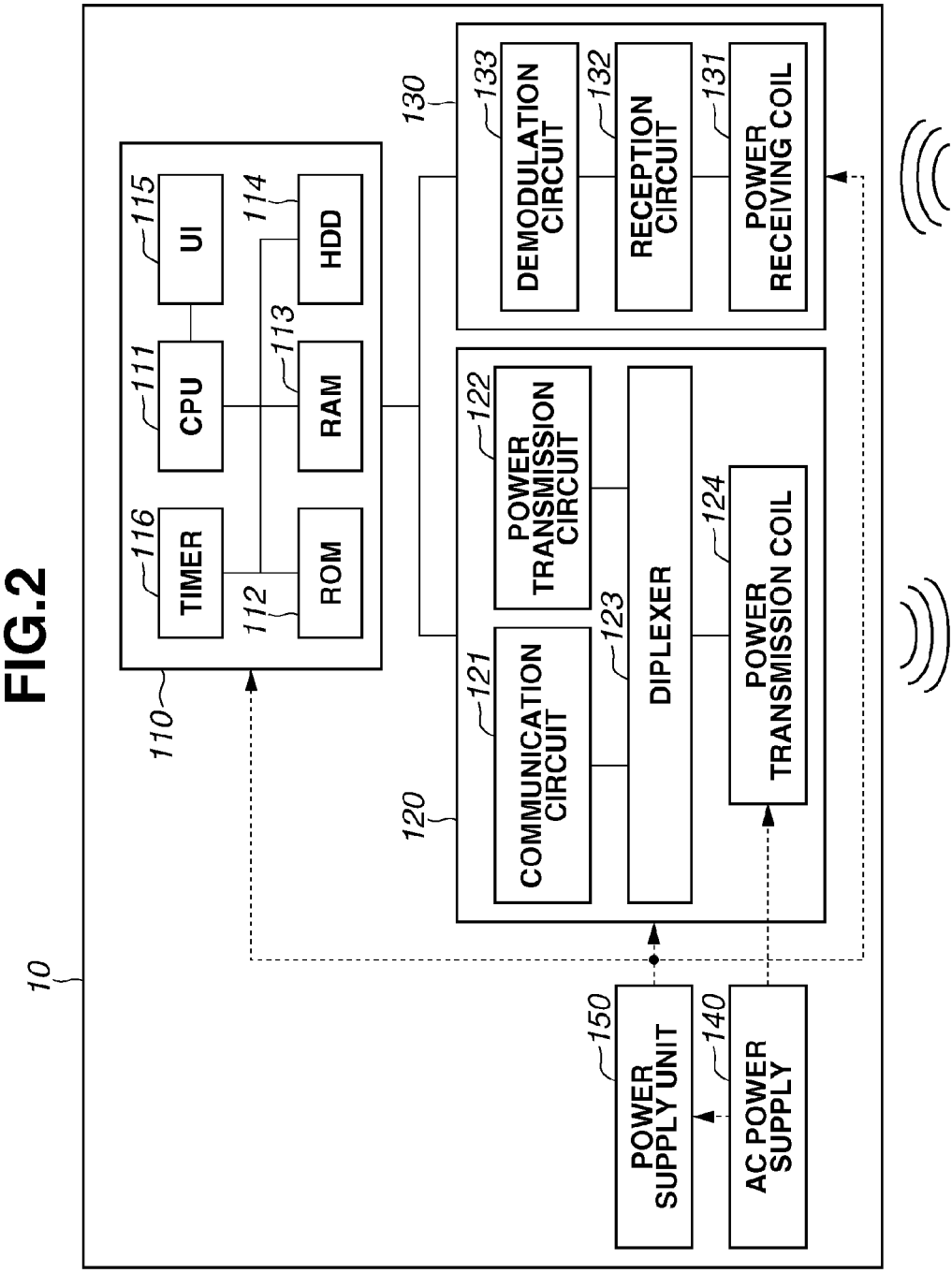
FIG. 2 is a block diagram illustrating a configuration of a power transmission device.

FIG. 2 is a block diagram illustrating a configuration of the power transmission device 10.

In FIG. 2, solid lines represent transmission and reception of data, and dotted lines represent supply of power.

The power transmission device 10 includes a control unit 110, a wireless transmission unit 120, a wireless reception unit 130, an alternating current (AC) power supply 140, and a power supply unit 150.

The control unit 110 controls each unit included in the power transmission device 10. The control unit 110 includes a central processing unit (CPU) 111, a read only memory (ROM) 112, a random access memory (RAM) 113, a hard disk drive (HDD) 114, a user interface (UI) 115, and a timer 116. The control unit 110 is connected to the wireless transmission unit 120 and the wireless reception unit 130 via an internal bus to enable transmission and reception of a signal.

The CPU 111 performs various types of operations to control the power transmission device 10.

The ROM 112 is a non-volatile storage medium and stores a boot program and the like to be used by the CPU 111.

The RAM 113 is a volatile storage medium and temporarily stores the data, program, and the like to be used by the CPU 111. Further, the RAM 113 retains, for each power receiving device, information about the amount of charge and the operating status used in the present exemplary embodiment each time a timer interruption occurs.

The HDD 114 is a non-volatile storage medium, and stores an operating system (OS) and application program (computer program) to be used by the CPU 111.

The UI 115 provides a user with various types of information and also receives various types of instructions from the user. A display device (e.g., a liquid crystal display device) that can display characters and images, and an audio device that can produce sound can be used as the UI 115.

The timer 116 starts counting down at the same time as power transmission has been started, and notifies the CPU 111 of its interruption when a predetermined time has elapsed.

The CPU 111 reads a computer program stored in the HDD 114, and loads the program into the RAM 113 for execution. This allows each unit of the power transmission device 10 to be controlled to implement the processing to be described below.

The wireless transmission unit 120 is configured to wirelessly transmit power to the power receiving devices 20, 21, and 22. The wireless transmission unit 120 includes a communication circuit 121, a power transmission circuit 122, a diplexer 123, and a power transmission coil 124.

The communication circuit 121 generates a modulation signal for performing wireless communication.

The power transmission circuit 122 generates a modulation signal for wirelessly transmitting power.

The diplexer 123 combines the modulation signal generated by the communication circuit 121 and the modulation signal generated by the power transmission circuit 122.

The power transmission coil 124 transmits the modulation signal combined by the diplexer 123 to the power receiving device 20.

The wireless reception unit 130 is configured to receive data from the power receiving device 20. The wireless reception unit 130 includes a power receiving coil 131, a reception circuit 132, and a demodulation circuit 133.

The power receiving coil 131 wirelessly receives a modulation signal for performing communication from each of the power receiving devices 20, 21, and 22.

The reception circuit 132 receives the modulation signal received by the power receiving coil 131.

The demodulation circuit 133 demodulates the modulation signal received by the reception circuit 132.

The AC power supply 140 supplies an AC voltage to the power transmission coil 124 and the power supply unit 150.

The power supply unit 150 converts the AC voltage supplied by the AC power source 140 into a direct current (DC) voltage, and supplies the DC voltage to the control unit 110, the wireless transmission unit 120, and the wireless reception unit 130.

Figure 3:
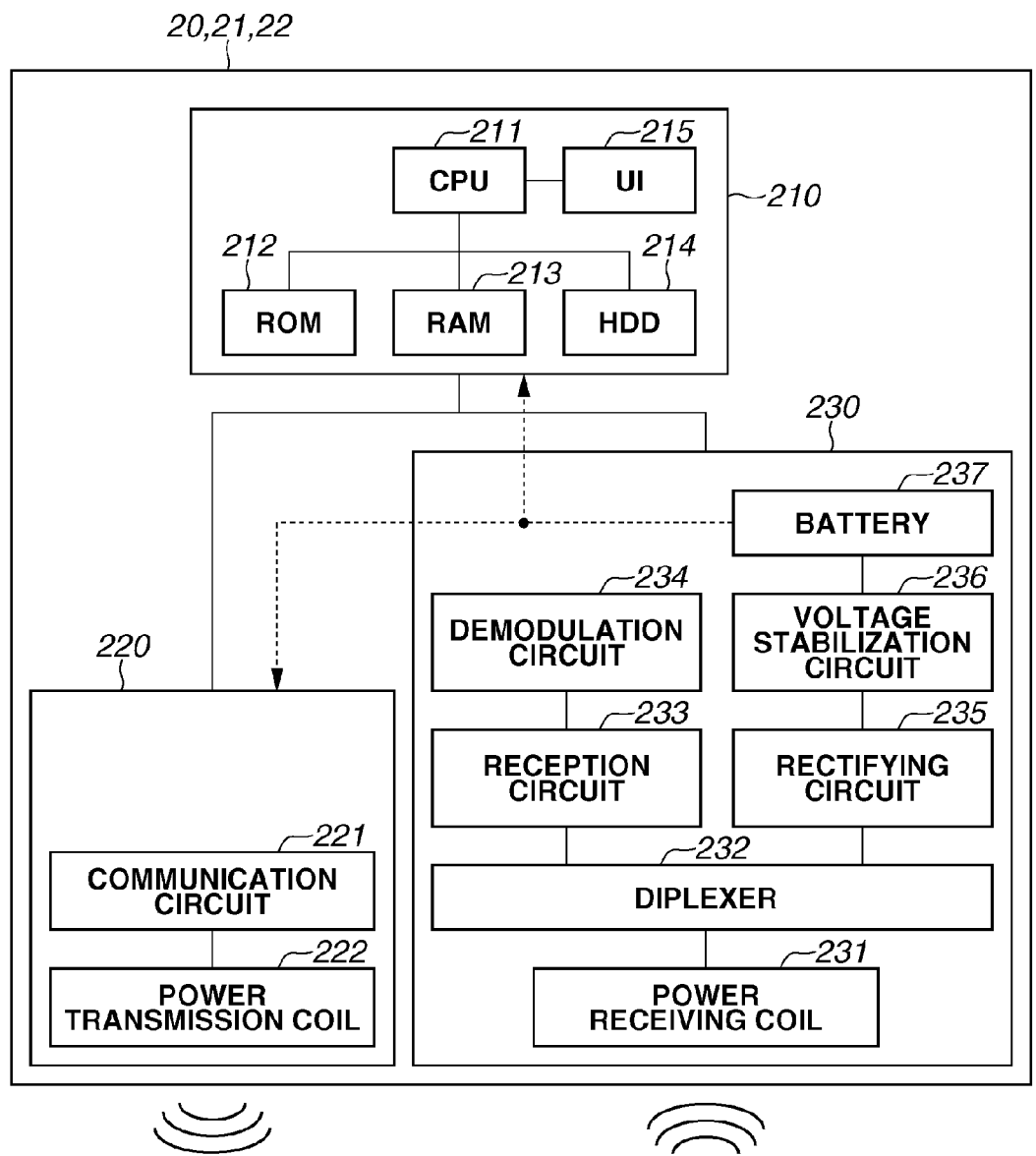
FIG. 3 is a block diagram illustrating a configuration of a power receiving device.

FIG. 3 is a block diagram illustrating a configuration of each of the power receiving devices 20, 21, and 22.

In FIG. 3, solid lines represent transmission and reception of data, and dotted lines represent supply of power.

Each of the power receiving devices 20, 21, and 22 includes a control unit 210, a wireless transmission unit 220, and a wireless reception unit 230.

The control unit 210 is configured to control each of the power receiving devices 20, 21, and 22. The control unit 210 includes a CPU 211, a ROM 212, a RAM 213, an HDD 214, and a UI 215. The control unit 210 is connected to the wireless transmission unit 220 and the wireless reception unit 230 via an internal bus to enable transmission and reception of a signal.

The CPU 211 performs various types of operation processing to control each of the power receiving devices 20, 21, and 22. The ROM 212 is a non-volatile storage medium, and stores a boot program to be used by the CPU 211.

The RAM 213 is a volatile storage medium, and temporarily stores the data, program, and the like to be used by the CPU 211.

The HDD 214 is a non-volatile storage medium, and stores an OS and application to be used by the CPU 211.

The UI 215 provides a user with various types of information and also receives various types of instructions from the user. A display device (e.g., a liquid crystal display device) that can display characters and images, and an audio device that can produce sound can be used as the UI 215.

The wireless transmission unit 220 is configured to wirelessly transmit data to the power transmission device 10. The wireless transmission unit 220 includes a communication circuit 221 and a power transmission coil 222.

The communication circuit 221 generates a modulation signal for performing communication.

The power transmission coil 222 wirelessly transmits the modulation signal generated by the communication circuit 221 to the power transmission device 10.

The wireless reception unit 230 is configured to wirelessly receive power from the power transmission device 10. The wireless reception unit 230 includes a power receiving coil 231, a diplexer 232, a reception circuit 233, a demodulation circuit 234, a rectifying circuit 235, a voltage stabilization circuit 236, and a battery 237.

The power receiving coil 231 receives a modulation signal from the power transmission device 10.

The diplexer 232 divides the modulation signal received by the power receiving coil 231 into a modulation signal for performing communication and a modulation signal for transmitting power.

The reception circuit 233 receives the modulation signal for performing communication output from the diplexer 232.

The demodulation circuit 234 demodulates the modulation signal received by the reception circuit 233.

The rectifying circuit 235 rectifies the modulation signal for transmitting power output from the diplexer 232 to generate a DC voltage.

The voltage stabilization circuit 236 stabilizes the DC voltage generated by the rectifying circuit 235.

The battery 237 receives the voltage stabilized by the voltage stabilization circuit 236 to accumulate power. The battery 237 supplies the DC voltage to the control unit 210, the wireless transmission unit 220, and the wireless reception unit 230 based on the accumulated power.

Figure 4:
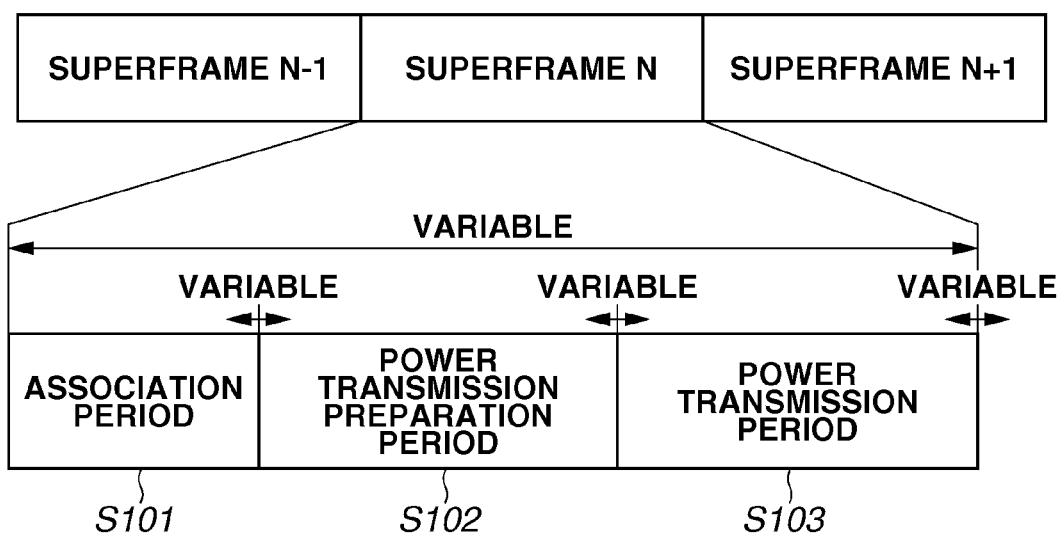
FIG. 4 illustrates a configuration of a superframe.

FIG. 4 illustrates a configuration of a superframe. In the wireless power supply system 1 according to the exemplary embodiment of the present invention, such a superframe is repeatedly used to realize wireless power supply. One superframe includes an association period (step S101), a power transmission preparation period (step S102), and a power transmission period (step S103). The length of each period is variable.

In step S101, the power transmission device 10 issues a request for a device ID to each of the power receiving devices 20, 21, and 22, and checks the necessity for each of the power receiving devices 20, 21, and 22 to receive power. If the power transmission device 10 receives the device ID and confirms that power transmission is necessary, and the processing proceeds to step S102. The period for shifting from step S101 to step S102 is also variable.

In step S102, each of the power receiving devices 20, 21, and 22 can transmit a response frame or an acknowledgement frame in response to a data request from the power transmission device 10. Each length of the response frame and the acknowledgement frame is variable. When step S102 has ended, the processing proceeds to step S103. The period for shifting from step S102 to step S103 is also variable.

In step S103, the power transmission device 10 wirelessly transmits power to each of the power receiving devices 20, 21, and 22. In step S103, each of the power receiving devices 20, 21, and 22 can transmit a frame to the power transmission device 10 even if each of the power receiving devices 20, 21, and 22 does not receive a request frame from the power transmission device 10.

Figure 5:
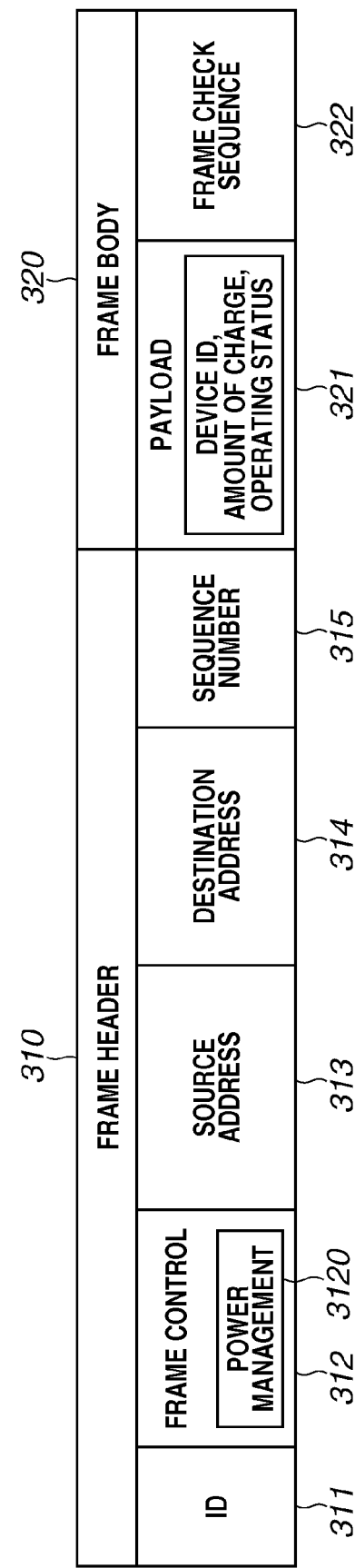
FIG. 5 illustrates a configuration of a frame format.

FIG. 5 illustrates a configuration of a frame format. Within the above-described superframe, data communication for wirelessly supplying power can be realized by using a packet in the frame format illustrated in FIG. 5.

A frame header 310 indicates an address for transferring data and the like. The frame header 310 includes an ID 311, a frame control 312, a source address 313, a destination address 314, and a sequence number 315.

The ID 311 is used to perform data communication in the wireless power supply system 1.

The frame control 312 is information for exchanging data about each of the power receiving devices 20, 21, and 22. The frame control 312 includes power management 3120. The power management 3120 is data used for checking the necessity of power.

The source address 313 is an address from which data is to be transferred.

The destination address 314 is an address to which data is to be transferred.

The sequence number 315 is the number for a frame.

A frame body 320 is information of the main body of data to be transferred. The frame body 320 includes a payload 321 and a frame check sequence 322.

The payload 321 is the main body of data. According to the present exemplary embodiment, an device ID, the amount of charge (the state of charge), and an operating status are assigned to the payload 321.

The frame check sequence 322 is data used for checking the payload 321 for errors.

As described above, the power transmission device 10 communicates with each of the power receiving devices 20, 21, and 22 by using a packet in the frame format illustrated in FIG. 5 to detect the amount of charge and the operating status of each of the power receiving devices 20, 21, and 22.

FIGS. 6A and 6B are sequence diagrams illustrating transmission and reception of data using the superframe between the power transmission device 10 and each of the power receiving devices 20, 21, and 22. More specifically, FIG. 6A illustrates a communication sequence when a first communication is performed with each of the power receiving devices 20, 21, and 22 or when the interruption of the timer 116 described with reference to FIG. 1 occurs. FIG. 6B illustrates a communication sequence when the interruption of the timer 116 does not occur.

The power transmission device 10 and each of the power receiving devices 20, 21, and 22 perform transmission and reception of data using the above-described superframe, as illustrated in FIGS. 6A and 6B. This enables the wireless power supply system 1 to perform data communication for wirelessly supplying power.

In step S201, the power transmission device 10 sends a request for the device ID to each of the power receiving devices 20, 21, and 22. For the request, the ID 311 of the frame format is used. Each of the power receiving devices 20, 21, and 22 receives the request for the device ID from the power transmission device 10.

In step S202, each of the power receiving devices 20, 21, and 22 transmits the device ID to the power transmission device 10. For the transmission, the ID 311 of the frame format is used. The power transmission device 10 receives the device ID from each of the power receiving devices 20, 21, and 22.

In step S203, the power transmission device 10 checks the necessity for each of the power receiving devices 20, 21, and 22 to receive power. For the check, the power management 3120 of the frame format is used. Each of the power receiving devices 20, 21, and 22 receives from the power transmission device 10 a packet for checking the necessity to receive power.

In step S204, if each of the power receiving devices 20, 21, and 22 needs to receive power, each of the power receiving devices 20, 21, and 22 notifies the power transmission device 10 that power transmission is necessary. In step S204, if each of the power receiving devices 20, 21, and 22 does not need to receive power, each of the power receiving devices 20, 21, and 22 notifies the power transmission device 10 that power transmission is not necessary. For the notification, the power management 3120 of the frame format is used. The power transmission device 10 receives a notification from each of the power receiving devices 20, 21, and 22 about whether power transmission is necessary. The power transmission device 10 determines whether the received notification is for requesting power transmission.

In step S205, if the power transmission device 10 receives a notification for requesting power transmission, the power transmission device 10 prepares power transmission.

In step S206, the power transmission device 10 transmits a command to each of the power receiving devices 20, 21, and 22 to identify how much the power charging rate for each of the power receiving devices 20, 21, and 22 is. Each of the power receiving devices 20, 21, and 22 receives the command from the power transmission device 10.

In step S207, each of the power receiving devices 20, 21, and 22 transmits a response about the power charging rate in response to the command transmitted from the power transmission device 10. The power transmission device 10 receives the response about the power charging rate from each of the power receiving devices 20, 21, and 22.

In step S208, the power transmission device 10 transmits power to each of the power receiving devices 20, 21, and 22. Each of the power receiving devices 20, 21, and 22 wirelessly receives power supply from the power transmission device 10 and charges the battery 237 using the supplied power.

In step S209, when the battery 237 has been fully charged, each of the power receiving devices 20, 21, and 22 notifies the power transmission device 10 of end of power transmission (completion of charging). For the notification, the power management 3120 of the frame format is used. The power transmission device 10 receives the notification about end of power transmission (completion of charging) from each of the power receiving devices 20, 21, and 22.

As illustrated in FIG. 6B, in the superframe where the interruption of the timer 116 does not occur, checking the amount of charge in step S206 and sending the response thereto, i.e., a response about the amount of charge in step S207 are skipped.

Figure 7:
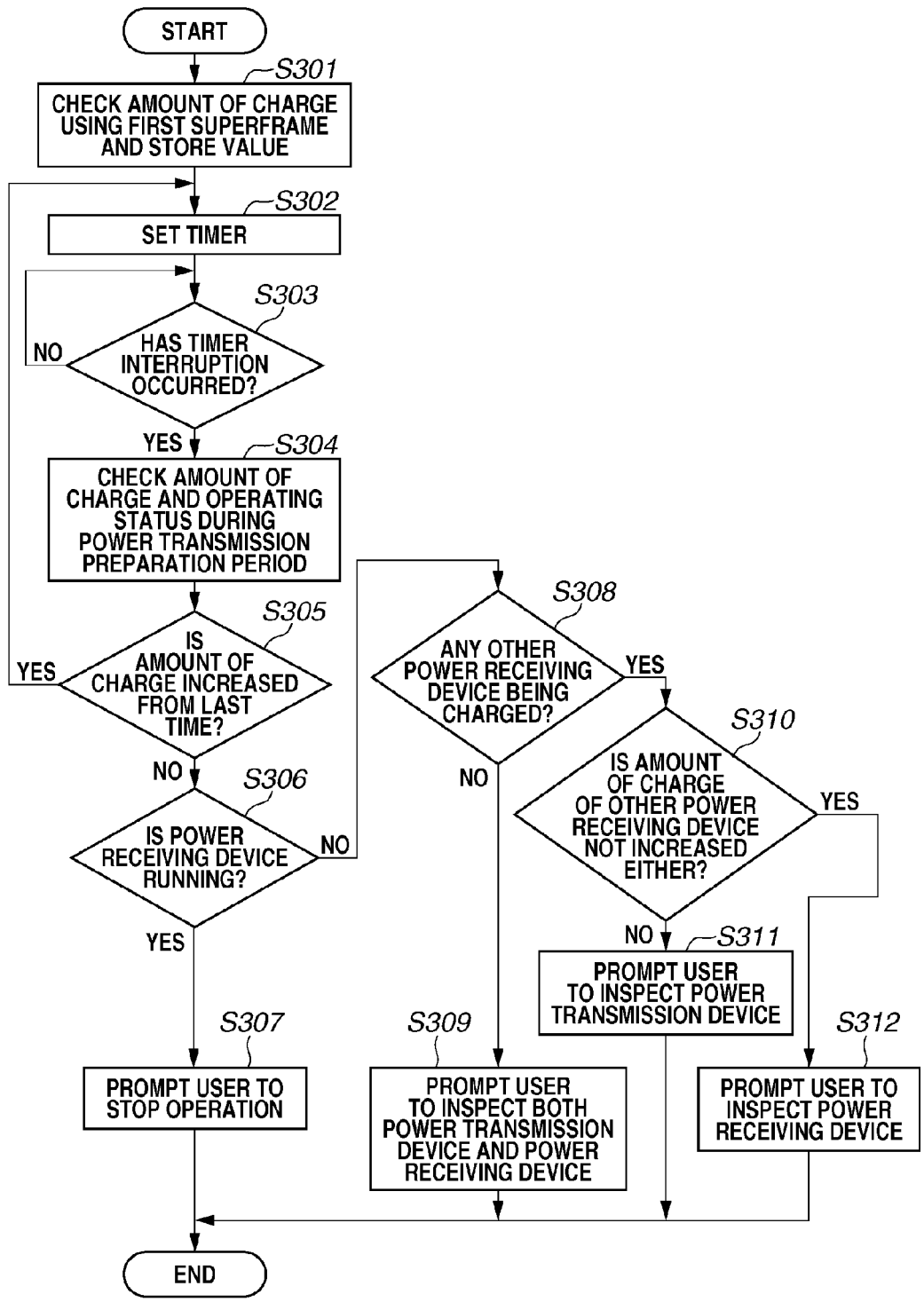
FIG. 7 is a flowchart illustrating a sequence according to an exemplary embodiment of the present invention.

FIG. 7 is a flowchart illustrating a control method according to the present exemplary embodiment. A computer program for executing the control method is stored in the HDD 114 of the power transmission device 10 and in the HDD 214 of each of the power receiving devices 20, 21, and 22. The CPU 111 of the power transmission device 10 and the CPU 211 of each of the power receiving devices 20, 21, and 22 read and execute the computer program. This enables each unit in the power transmission device 10 and in each of the power receiving devices 20, 21, and 22 to be controlled to implement the control method.

The wireless power supply system 1 according to the present exemplary embodiment includes the plurality of power receiving devices 20, 21, and 22. Here, however, the power receiving device 20 will be used as an example to describe the flow of operations of the power transmission device 10 and the power receiving device 20.

When the power receiving device 20 has entered the communication area 40 of the power transmission device 10, the power transmission device 10 and the power receiving device 20 start the processing illustrated in FIG. 7.

In step S301, when the power receiving device 20 has entered the communication area 40 of the power transmission device 10, the power transmission device 10 and the power receiving device 20 perform the first communication using the superframe illustrated in FIG. 4. Through the first communication, the power transmission device 10 detects the amount of charge of the power receiving device 20 and stores the detected charge amount information in the RAM 113. The information about the amount of charge of the power receiving device 20 is included in a response about the amount of power received from the power receiving device 20 in step S207 during the power transmission preparation period (step S102).

In step S302, the CPU 111 of the power transmission device 10 sets the timer interruption timing for the timer 116.

In step S303, the CPU 111 of the power transmission device 10 stands by until the interruption by the timer 116 occurs. During the standby state, as illustrated in FIG. 6B, the power transmission device 10 and the power receiving device 20 perform communication using the superframe without checking the amount of charge and sending a response about the amount of charge. When the interruption by the timer 116 has occurred (YES in step S303), the processing proceeds to step S304.

In step S304, communication is performed between the power transmission device 10 and the power receiving device 20 right after the timer interruption has occurred. In step S304, the power transmission device 10 and the power receiving device 20 communicate with each other in the sequence illustrated in FIG. 6A at the timing of communication using the superframe illustrated in FIG. 4. The power transmission device 10 detects the amount of charge and the operating status in the payload 321.

In step S305, the CPU 111 of the power transmission device 10 compares information about the amount of charge stored in the RAM 113 (the amount of charge obtained last time) with information about the amount of charge obtained in step S304 (the amount of charge obtained this time). If the amount of charge obtained this time in step S304 is larger than that obtained last time and stored in the RAM 113, it indicates that charging is in progress. If charging is in progress (YES in step S305), the processing proceeds to step S302. On the other hand, if the amount of charge obtained this time in step S304 is equal to or smaller than that obtained last time and stored in the RAM 113, it indicates that charging may not be normally performed. If charging may not be normally performed (NO in step S305), the processing proceeds to step S306.

In step S306, the CPU 111 of the power transmission device 10 determines based on the operating status obtained in step S304 whether the power receiving device 20 is being operated. When it is determined that the power receiving device 20 is being operated (YES in step S306), the processing proceeds to step S307. When it is determined that the power receiving device 20 is standing by or stopping (NO in step S306), the processing proceeds step S308.

In step S307, the CPU 111 of the power transmission device 10 first transmits to the power receiving device 20 via the wireless transmission unit 120 a notification to prompt the user to stop receiving power supply. When the CPU 211 of the power receiving device 20 has received from the power transmission device 10 the notification to prompt the user to stop receiving power supply, the CPU 211 notifies and prompts the user via the UI 215 to stop receiving power supply while operating the power receiving device 20. As the notification method, for example, the CPU 211 of the power receiving device 20 can use a method for displaying "a message for prompting the user to stop receiving power supply while operating the power receiving device 20" on the display unit (notification unit) of the UI 215. Alternatively, a method for causing the UI 215 to generate a notification sound may be used.

In step S308, the CPU 111 of the power transmission device 10 determines whether the power transmission device 10 is supplying power to any power receiving device other than the power receiving device 20. If the power transmission device 10 is supplying power to any other power receiving device (e.g., power receiving device 21) (YES in step S308), the processing proceeds to step S310. If the power transmission device 10 is supplying power only to the power receiving device 20 (NO in step S308), the processing proceeds to step S309.

If the power transmission device 10 is supplying power only to the power receiving device 20, the CPU 111 of the power transmission device 10 cannot compare the state of charge of the power receiving device 20 with that of any other power receiving device. Thus, the CPU 111 of the power transmission device 10 cannot determine whether a cause of failure to increase the amount of charge is the power transmission device 10 or the power receiving device 20.

Thus, in step S309, the CPU 111 of the power transmission device 10 executes processing (operation) to prompt the user to inspect both the power transmission device 10 and the power receiving device 20.

For example, the CPU 111 of the power transmission device 10 transmits to the power receiving device 20 via the wireless transmission unit 120 a determination result indicating that both the power transmission device 10 and the power receiving device 20 are the cause of failure to increase the amount of charge. When the power receiving device 20 has received the determination result, the power receiving device 20 notifies and prompts the user via the UI 215 to inspect both the power transmission device 10 and the power receiving device 20. As the notification method, for example, the CPU 211 of the power receiving device 20 can use a method for displaying "a message for prompting the user to inspect both the power transmission device 10 and the power receiving device 20" on the display unit (notification unit) of the UI 215. Alternatively, a method for causing the UI 215 to generate a notification sound may be used.

The CPU 111 of the power transmission device 10 may be configured to wirelessly transmit, instead of the determination result itself, a notification for causing the power receiving device 20 to execute processing for prompting the user to inspect both the power transmission device 10 and the power receiving device 20. When the power receiving device 20 has received the notification, the power receiving device 20 executes the processing for notifying and prompting the user to inspect both the power transmission device 10 and the power receiving device 20, similarly to the above.

Further, the CPU 111 of the power transmission device 10 may notify and prompt the user to inspect both the power transmission device 10 and the power receiving device 20 via the UI 115. As the notification method, for example, the CPU 111 of the power transmission device 10 can use a method for displaying "a message for prompting the user to inspect both the power transmission device 10 and the power receiving device 20" on the display unit of the UI 115. Alternatively, a method for causing the UI 115 to generate a notification sound may be used.

If the power transmission device 10 is supplying power to any power receiving device other than the power receiving device 20 (YES in step S308), the processing proceeds to step S310.

In step S310, the CPU 111 of the power transmission device 10 determines whether the amount of charge of the power receiving device (e.g., power receiving device 21) other than the power receiving device 20 is increased. If the amount of charge of the other power receiving device 21 is not increased (NO in step S310), the processing proceeds to step S311. If the amount of charge of the other power receiving device 21 is increased (YES in step S310), the processing proceeds to step S312.

If the amount of charge of the other power receiving device 21 is not increased, it can be assumed that the power transmission device 10 is the cause of failure to increase the amount of charge. Then in step S311, the CPU 111 of the power transmission device 10 determines that the power transmission device 10 is the cause of failure to increase the amount of charge, and executes processing (operation) for prompting the user to inspect the power transmission device 10.

For example, the CPU 111 of the power transmission device 10 transmits to the power receiving device 20 via the wireless transmission unit 120 a determination result indicating that the power transmission device 10 is the cause of failure to increase the amount of charge. When the power receiving device 20 has received the determination result, the power receiving device 20 notifies and prompts the user via the UI 215 to inspect the power transmission device 10. As the notification method, for example, the CPU 211 of the power receiving device 20 can use a method for displaying "a message for prompting the user to inspect the power transmission device 10" on the display unit of the UI 215. Further, a method for causing the UI 215 to generate a notification sound may be used.

The CPU 111 of the power transmission device 10 may wirelessly transmit, instead of the determination result itself, a notification for causing the power receiving device 20 to execute processing for prompting the user to inspect the power transmission device 10. When the power receiving device 20 has received the notification, the power receiving device 20 executes the processing (operation) for notifying the user, similarly to the above.

If the amount of charge of the other power receiving device 21 is increased, it can be assumed that the power receiving device 20 is the cause of failure to increase the amount of charge. In step S312, the CPU 111 of the power transmission device 10 determines that the power receiving device 20 is the cause of failure to increase the amount of charge, and executes processing (operation) for prompting the user to inspect the power receiving device 20.

For example, the CPU 111 of the power transmission device 10 notifies the power receiving device 20 of the determination result via the wireless transmission unit 120. When the power receiving device 20 has received the determination result, the power receiving device 20 notifies and prompts the user via the UI 215 to inspect the power receiving device 20. As the notification method, for example, the CPU 211 of the power receiving device 20 can use a method for displaying "a message for prompting the user to inspect the power receiving device 20" on the display unit (notification unit) of the UI 215. Alternatively, a method for causing the UI 215 to generate a notification sound may be used.

The CPU 111 of the power transmission device 10 may wirelessly transmit, instead of the determination result itself, a notification according to the determination result, for example, a notification for causing the power receiving device 20 to execute the processing for prompting the user to inspect the power receiving device 20. When the power receiving device 20 has received the notification, the power receiving device 20 notifies and prompts the user via the UI 215 to inspect the power receiving device 20, similarly to the above.

As described above, the CPU 111 of the power transmission device 10 determines whether the cause of failure to increase the amount of charge is the power transmission device 10 or the power receiving device 20, and transmits to the power receiving device 20 a notification according to the determination result.

Subsequently, an example of an operation of the wireless power supply system 1 according to the exemplary embodiment of the present invention will be described. It is assumed here that the battery 237 of the power receiving device 20 is the cause of failure to increase the amount of charge. It is also assumed that in the power supply area 30 of the power transmission device 10, there is a normal power receiving device 21 other than the power receiving device 20.

To charge the battery 237 of the power receiving device 20, the user sets the power receiving device 20 to a stand-by state in the power supply area 30 of the power transmission device 10.

When the power receiving device 20 has been placed in the power supply area 30 of the power transmission device 10, the power transmission device 10 and the power receiving device 20 perform the first communication using the superframe in the sequence illustrated in FIG. 6A. In step S206, via the first communication, the power transmission device 10 asks the power receiving device 20 about the amount of charge and the operating status. In step S207, the power receiving device 20 notifies the power transmission device 10 of the amount of charge and the operating status. In step S301, the CPU 111 of the power transmission device 10 temporarily stores in the RAM 113 the amount of charge and the operating status of the power receiving device 20 obtained via the communication.

In step S302, the CPU 111 of the power transmission device 10 sets the timing of a timer interruption for the timer 116 (causes the timer 116 to start counting down). In step S303, the CPU 111 of the power transmission device 10 waits until the timer interruption occurs while communicating with the power receiving device 20 according to the sequence illustrated in FIG. 6B.

When a predetermined time has elapsed since the timer 116 started counting down, the interruption by the timer 116 occurs (an interruption signal is transmitted to the CPU 111). In step S304, the CPU 111 communicates with the power receiving device 20 to check (detect) the amount of charge and the operating status. The power transmission device 10 performs the communication according to the sequence illustrated in FIG. 6A.

In step S207, when the CPU 111 of the power transmission device 10 has received a response about the amount of charge and the operating status from the power receiving device 20, then in steps S305 and S306, the CPU 111 determines the amount of charge and the operating status of the power receiving device 20 obtained this time. In step S305, the CPU 111 of the power transmission device 10 compares the amount of charge obtained last time and temporarily stored in the RAM 113 with the amount of charge obtained this time to determine whether the amount of charge is increased.

It is assumed here that the battery 237 of the power receiving device 20 is the cause of failure to increase the amount of charge, and thus the amount of charge is not increased even when a predetermined time has elapsed since the start of charging.

Therefore, in step S306, the CPU 111 of the power transmission device 10 checks the operating status of the power receiving device 20.

Since the operating status of the power receiving device 20 is in the stand-by state (NO in step S306), then in step S308, the CPU 111 of the power transmission device 10 determines whether there is any other power receiving device being charged.

Since it is assumed that there is other power receiving device 21 in the power supply area 30 (YES in step S308), then in step S310, the CPU 111 of the power transmission device 10 checks whether the amount of charge of the other power receiving device 21 is increased.

Since it is also assumed that the power receiving device 21 is in a normal state, the amount of charge of the power receiving device 21 is increased when power is transmitted thereto. Therefore, in step S310, when the CPU 111 of the power transmission device 10 uses information about the amount of charge of the other power receiving device 21 that is periodically retained in the RAM 113 to compare the amount of charge obtained this time with that obtained last time, the CPU 111 determines that the amount of charge is increased.

With the above assumptions, the CPU 111 of the power transmission device 10 determines that, among the plurality of power receiving devices, only the power receiving device 20 fails to increase the amount of charge. Thus, the CPU 111 of the power transmission device 10 notifies the power receiving device 20 via the wireless transmission unit 120 that the power receiving device 20 may cause the failure to increase the amount of charge. Or, the CPU 111 of the power transmission device 10 displays on the UI 115 a message saying that the power receiving device 20 may cause the failure to increase the amount of charge.

As described above, in the wireless power supply capable of supplying power to the plurality of devices, the CPU 111 of the power transmission device 10 detects the operating status of the power receiving device 20 and whether the amount of charge of the power receiving device 20 is increased. This can improve the performance of detecting, if the amount of charge of the power receiving device 20 is not increased even when power has been supplied for a predetermined time, whether the cause of failure is the power transmission device 10 or the power receiving device 20.

In the present exemplary embodiment, the configuration for checking the amount of charge using the timing of interruption by the timer 116 has been described. However, the present invention is not limited thereto. For example, to set the timing of checking the amount of charge, the number of times of transmitting the superframe may be used. In this case, the CPU 111 of the power transmission device 10 counts the number of times of transmitting the superframe to the power receiving device 20. The CPU 111 of the power transmission device 10 checks (detects) the amount of charge of the power receiving device 20 each time the counted number of times of the transmission reaches a predetermined number of times. The predetermined number of times is not particularly limited. In such a configuration, the above-described effect can also be obtained.

The point is that the power transmission device 10 includes a time counting unit capable of counting the elapsed time and is configured to detect the amount of charge of the power receiving device 20 each time the time counted by the time counting unit reaches the predetermined time.

The power transmission device and the power receiving device according to the exemplary embodiment of the present invention are not particularly limited. As the power receiving device, various types of portable apparatuses can be applied, such as a mobile phone, a mobile gaming machine, a mobile music player, and a digital camera. Further, the power transmission device may not be a stand-alone power transmission device. For example, the power transmission device may be incorporated in various types of apparatuses, such as a copying machine, a printer, and a personal computer (PC).

Embodiments of the present disclosure can also be realized by a computer of a system or apparatus that reads out and executes computer executable instructions recorded on a storage medium (e.g., non-transitory computer-readable storage medium) to perform the functions of one or more of the above-described embodiment(s) of the present disclosure, and by a method performed by the computer of the system or apparatus by, for example, reading out and executing the computer executable instructions from the storage medium to perform the functions of one or more of the above-described embodiment(s). The computer may comprise one or more of a central processing unit (CPU), micro processing unit (MPU), or other circuitry, and may include a network of separate computers or separate computer processors. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-040930 filed Mar. 1, 2013, which is hereby incorporated by reference herein in its entirety.

What is claimed is:

1. A wireless power supply system including a power transmission device for transmitting power to a plurality of power receiving devices by a magnetic field resonance method, the power transmission device comprising:
   a detection unit configured to detect an amount of charge of each of the plurality of power receiving devices;
   a determination unit configured to determine, if the amount of charge of a certain power receiving device is not increased even when a predetermined time has elapsed since start of power transmission to the certain power receiving device, whether a cause of failure to increase the amount of charge is the power transmission device or the certain power receiving device, based on the amount of charge of any other power receiving device detected by the detection unit; and
   a notification unit configured to transmit a notification about a result of the determination by the determination unit.

2. The wireless power supply system according to claim 1, the power transmission device further comprising a time counting unit,
   wherein the detection unit detects the amount of charge of the certain power receiving device each time a time counted by the time counting unit reaches a predetermined time, and
   wherein the determination unit determines whether the amount of charge of the certain power receiving device is not increased by comparing the amount of charge detected by the detection unit this time with the amount of charge detected by the detection unit last time.

3. The wireless power supply system according to claim 1, the power transmission device further comprising a counting unit configured to count a number of times of transmission of a signal to the certain power receiving device,
   wherein the detection unit detects the amount of charge of the certain power receiving device each time the number of times of transmission counted by the counting unit reaches a predetermined number of times, and
   wherein the determination unit determines whether the amount of charge of the certain power receiving device is not increased by comparing the amount of charge detected by the detection unit for a current time with the amount of charge detected by the detection unit last time.

4. The wireless power supply system according to claim 1, wherein, if the determination unit determines that the amount of charge of the certain power receiving device is not increased, the determination unit determines that the certain power receiving device is the cause of failure to increase the amount of charge if the determination unit determines that the amount of charge of the other power receiving device is increased, and determines that the power transmission device is the cause of failure to increase the amount of charge if the determination unit determines that the amount of charge of the other power receiving device is not increased either.

5. A power transmission device for transmitting power to a plurality of power receiving devices by a magnetic field resonance method, the power transmission device comprising:
   a detection unit configured to detect an amount of charge of each of the plurality of power receiving devices;
   a determination unit configured to determine, if the amount of charge of a certain power receiving device is not increased even when a predetermined time has elapsed since start of power transmission to the certain power receiving device, whether a cause of failure to increase the amount of charge is the power transmission device or the certain power receiving device, based on the amount of charge of any other power receiving device detected by the detection unit; and
   a notification unit configured to notify the certain power receiving device of the determination result by the determination unit.

* * * * *